(12) United States Patent
Matsuda

(10) Patent No.: US 7,399,993 B2
(45) Date of Patent: Jul. 15, 2008

(54) DISPLAY UNIT AND METHOD FOR FABRICATING THE SAME

(75) Inventor: Eisuke Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 121 days.

(21) Appl. No.: 11/531,114

(22) Filed: Sep. 12, 2006

(65) Prior Publication Data
US 2007/0057264 A1    Mar. 15, 2007

(30) Foreign Application Priority Data
Sep. 12, 2005    (JP)    ............................. 2005-263367

(51) Int. Cl.
*H01L 51/20* (2006.01)
(52) U.S. Cl. .................. 257/89; 257/88; 257/E51.019; 257/E51.022; 438/35; 313/506
(58) Field of Classification Search .................. 257/40, 257/88, 89, 98, E51.018, E51.019, E51.022, 257/E51.027; 438/34, 35; 313/506
See application file for complete search history.

(56) References Cited

U.S. PATENT DOCUMENTS

| 6,274,979 B1 * | 8/2001 | Celii et al. .................. 313/506 |
| 6,890,627 B2 | 5/2005 | Culver et al. |
| 7,247,886 B2 * | 7/2007 | Mizuno et al. .............. 257/102 |
| 2004/0028942 A1 | 2/2004 | Culver et al. |
| 2005/0164033 A1 * | 7/2005 | Chin et al. .................. 428/690 |
| 2006/0017383 A1 * | 1/2006 | Ishida et al. ................ 313/512 |
| 2006/0279204 A1 * | 12/2006 | Forrest et al. ............... 313/506 |
| 2007/0007538 A1 * | 1/2007 | Ono et al. ..................... 257/79 |

FOREIGN PATENT DOCUMENTS

JP    2004-071551    3/2004

* cited by examiner

*Primary Examiner*—Evan Pert
*Assistant Examiner*—Victor A. Mandala, Jr.
(74) *Attorney, Agent, or Firm*—Bell, Boyd & Lloyd LLP

(57) ABSTRACT

A display unit and method of fabricating same are provided. The display unit includes a plurality of organic electroluminescent devices, each including an organic layer portion including at least a hole-transport layer and a luminescent layer which are stacked each other, and two electrodes sandwiching the organic layer portion. The luminescent layers of the individual organic electroluminescent devices have different thicknesses. The luminescent layer in each organic electroluminescent device contains an organic material having substantially the same HOMO level as that of a hole-transporting material constituting the hole-transport layer, the content of the organic material being set according to the thickness of the luminescent layer.

8 Claims, 4 Drawing Sheets

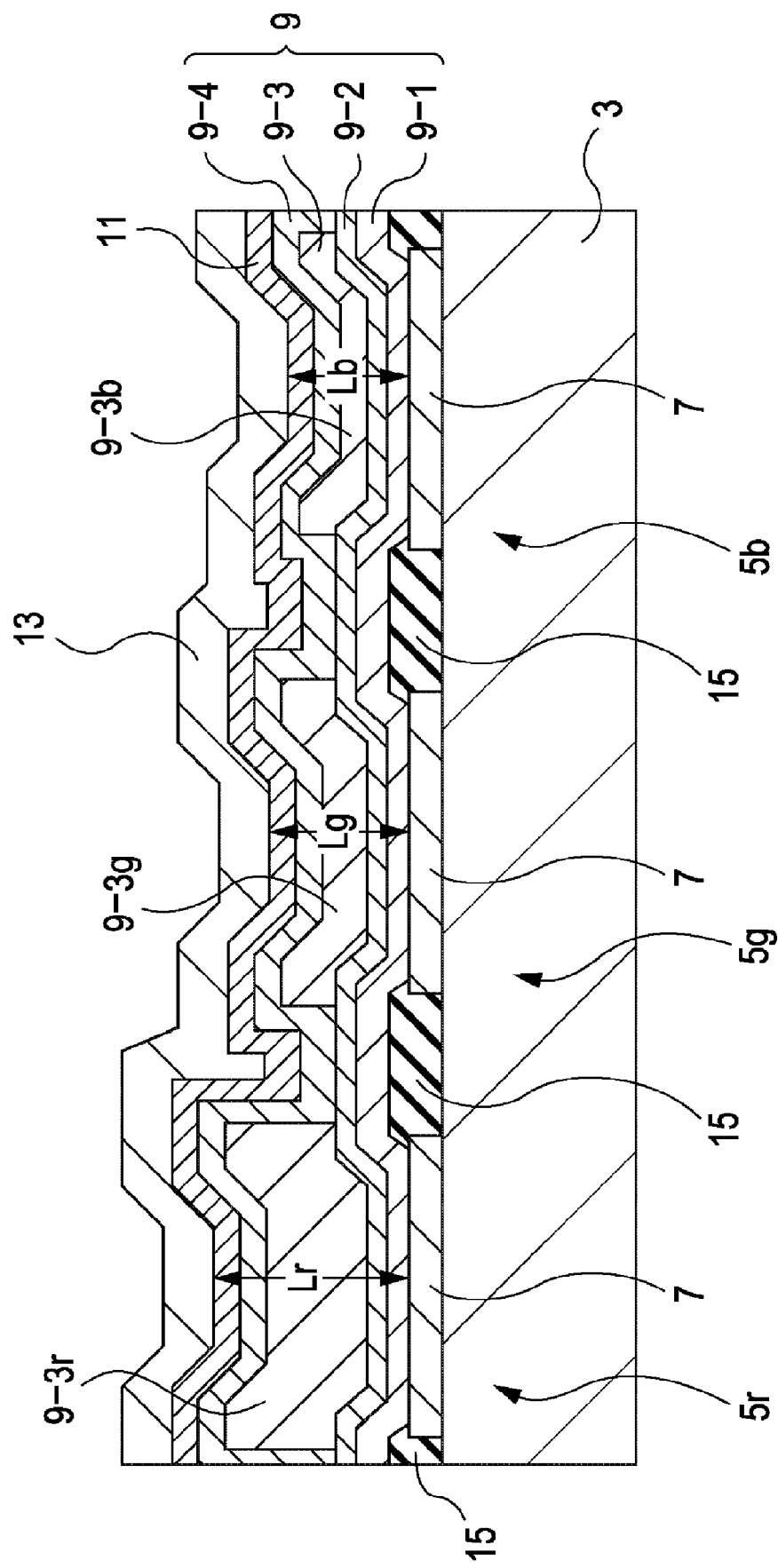

DISPLAY UNIT AND METHOD FOR FABRICATING THE SAME

CROSS REFERENCES TO RELATED APPLICATIONS

The present application claims priority to Japanese Patent Application JP 2005-263367 filed in the Japanese Patent Office on Sep. 12, 2005, the entire contents of which is incorporated herein by reference.

BACKGROUND

The present disclosure relates to a display unit and a method for fabricating the display unit. More particularly, the invention relates to a display unit in which organic electroluminescent devices that emit light of different colors are arrayed, the organic electroluminescent devices including luminescent layers, the thickness of which varies according to color.

Organic electroluminescent devices using electroluminescence of organic materials have been receiving attention as light-emitting devices capable of achieving high-luminance light emission at low-voltage DC drive, each organic electroluminescent device including an organic layer portion in which a hole-transport layer and a luminescent layer are disposed, the organic layer portion being provided between a lower electrode and an upper electrode. In a full color display unit including such organic electroluminescent devices, organic electroluminescent devices each emitting light of red (R), green (G), or blue (B) are arrayed on a substrate.

In such a display unit, a luminescent layer composed of at least a luminescent material of the corresponding color is formed by patterning for each device. Furthermore, by designing the devices, each emitting light of R, G, or B, to have a resonator structure in which only emitted light of the corresponding color is resonated and extracted, it is possible to improve the color purity of emitted light extracted from each device, and to increase the extraction efficiency of emitted light. In such an organic electroluminescent device, for example, an anode which also acts as a mirror, an organic layer which includes a luminescent layer, and a cathode which also acts as a half mirror, are disposed in that order. By setting the distance between the anode (mirror) and the cathode (half mirror) so as to be equal to the optical distance that allows light with a light-emitting wavelength of the corresponding color to resonate, only the characteristic wavelength in the emitted light generated in the luminescent layer is extracted from the cathode (half mirror) side.

When a display unit is fabricated using the organic electroluminescent devices of the individual colors having such a resonator structure, by adjusting the optical distance in each device only by the thickness of the luminescent layer, the other layers can be commonly used, and thus the fabrication process can be significantly simplified.

As a method for forming the luminescent layer by patterning, a thermal transfer method has been proposed. When the thermal transfer method is used, a display unit is fabricated, for example, as follows. First, an anode is formed on a substrate (hereinafter referred to as the "device substrate") of the display unit. In addition, a luminescent layer is formed on another substrate (hereinafter referred to as the "transfer substrate") with a light-absorption layer therebetween. The device substrate and the transfer substrate are placed such that the luminescent layer and the anode face each other, and the luminescent layer is thermally transferred onto the anode of the device substrate by irradiating the transfer substrate with laser light. At this stage, by performing scanning using spot irradiation of laser light, the luminescent layer is transferred only onto a predetermined region on the anode with high positional accuracy.

With respect to the use of the thermal transfer method, a method has been proposed in which a hole-transport layer is further formed on a light-absorbing layer of a transfer substrate with a luminescent layer therebetween, and then irradiation of sufficient light (laser light) is performed so that transfer is performed with the hole-transporting material being mixed into the luminescent material. By using such a method, the efficiency and stability of the organic electroluminescent device (OLED) are reported to be increased. (Refer to Japanese Unexamined Patent Application Publication No. 2004-71551, in particular, columns 8 to 10.)

SUMMARY

However, the display unit including organic electroluminescent devices of the individual colors having the resonator structure in which the optical distance between the mirror and the half mirror is adjusted only by the thickness of the luminescent layer has the following problem.

That is, in the organic layers constituting the organic electroluminescent device, the luminescent layer has a high resistance compared with the hole-transport layer which has a function of mainly transporting and injecting charges, and the like. Consequently, when the optical distance is adjusted only by the thickness of the luminescent layer, the difference in the thickness between the luminescent layers of the individual devices increases, resulting in a very large difference between the drive voltages for driving the individual devices.

Usually, in a display unit, the power supply voltage is set so as to meet the requirement of the device having the highest drive voltage. In the driving circuit, the drive voltages to be applied to the individual devices are generated by individually decreasing the power supply voltage so as to meet the drive voltages required by the individual devices. Therefore, when there is a large difference between the drive voltages required by the individual devices, the decrease in the voltage in the driving circuit increases, and thus power is wastefully consumed.

SUMMARY

It is desirable to provide a display unit in which it is possible to level out the drive voltages of the individual organic electroluminescent devices including luminescent layers having different thicknesses, thus achieving a decrease in the power consumption, and a method for fabricating the display unit.

A display unit according to an embodiment includes a plurality of organic electroluminescent devices, each including an organic layer portion in which at least a hole-transport layer and a luminescent layer are stacked, the organic layer portion being sandwiched between two electrodes, wherein the luminescent layers of the individual organic electroluminescent devices have different thicknesses. An example of such a display unit is a color display unit which includes organic electroluminescent devices, each having a microresonator structure and in which the optical distance of the resonant portion is adjusted by the thickness of the corresponding luminescent layer, so that light with different wavelengths is extracted. In the display unit according to the embodiment of the present invention, the luminescent layer in each device contains an organic material having substantially the same highest occupied molecular orbital (HOMO) level as that of a hole-transporting material constituting the hole-transport layer, the content of the organic material increasing with the thickness of the luminescent layer.

In the display unit having such a structure according to the embodiment, the organic material having substantially the same HOMO level as that of the hole-transporting material constituting the hole-transport layer is contained in the luminescent layer of each organic electroluminescent device. That is, in the organic electroluminescent device, by allowing the luminescent layer to contain such an organic material, the resistance of the luminescent layer is decreased, and thus the drive voltage can be decreased. Consequently, by allowing the luminescent layer having a larger thickness and a higher resistance to contain a larger amount of the organic material, the drive voltages of the individual organic electroluminescent devices including luminescent layers having different thicknesses can be leveled out at the low value.

A method for fabricating such a display unit according to another embodiment of the present invention includes the step of forming the luminescent layers by patterning using a thermal transfer method.

As described above, it is possible to level out the drive voltages of the plurality of organic electroluminescent devices including luminescent layers having different thicknesses. Consequently, for example, in a color display unit having microresonator structures, it is not necessary to individually decrease the power supply voltage applied to the display unit so as to meet the required drive voltages for the individual devices. Thus, it is possible to reduce waste power consumption during decreases in the voltage.

Additional features and advantages are described herein, and will be apparent from, the following Detailed Description and the figures.

BRIEF DESCRIPTION OF THE FIGURES

FIG. 1 is a schematic cross-sectional view of a display unit according to an embodiment of the present invention.

DETAILED DESCRIPTION

Figure 2A:
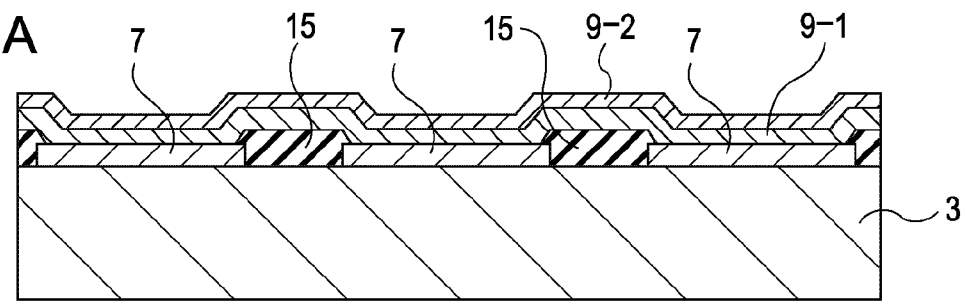
FIGS. 2A to 2H are schematic cross-sectional views showing steps in a method for fabricating a display unit according to another embodiment of the present invention.

Embodiments will be described below with reference to the drawings. In each embodiment, a display unit in which organic electroluminescent devices, each emitting light of red (R), green (G), or blue (B), are arrayed on a substrate to perform full color display will be described.

Display Unit

FIG. 1 is a schematic diagram of a display unit according to an embodiment of the present invention. Referring to FIG. 1, in a display unit 1, organic electroluminescent devices 5r, 5g, and 5b which emit light of red (R), green (G), and blue (B), respectively, i.e., a red light-emitting device 5r, a green light-emitting device 5g, and a blue light-emitting device 5b, are arrayed on a substrate 3, and the display unit 1 is designed to be of a top-emission type in which light emitted from each of the light-emitting devices 5r, 5g, and 5b is extracted from a side opposite to the substrate 3.

The substrate 3 is a TFT substrate in which thin film transistors (TFTs) (not shown in the drawing) are arrayed on a surface layer of a glass base, a silicon base, a plastic base, or the like. The surface of the substrate 3 is covered with a planarizing insulation film.

In each of the light-emitting devices 5r, 5g, and 5b, an anode 7, an organic layer portion 9, an electron-injection layer 11, and a cathode 13 are disposed in that order on the substrate 3. In each of the light-emitting devices 5r, 5g, and 5b, the anode 7 is a mirror (light reflection layer) and the cathode 13 is a half mirror (semi-transmissive layer). A microresonator structure is designed in which light with specific wavelengths generated in each of the light-emitting devices 5r, 5g, and 5b is resonated and extracted from the cathode (half mirror) 13 side.

That is, in the red light-emitting device 5r, the optical distance Lr of the resonant portion is adjusted such that light in the red wavelength range is resonated in the resonant portion between the anode (mirror) 7 and the cathode (half mirror) 13 to maximize the extraction efficiency. In the green light-emitting device 5g, the optical distance Lg of the resonant portion is adjusted such that light in the green wavelength range is resonated in the resonant portion between the anode (mirror) 7 and the cathode (half mirror) 13 to maximize the extraction efficiency. In the blue light-emitting device 5b, the optical distance Lb of the resonant portion is adjusted such that light in the blue wavelength range is resonated in the resonant portion between the anode (mirror) 7 and the cathode (half mirror) 13 to maximize the extraction efficiency. Thus, from the light-emitting devices 5r, 5g, and 5b, emitted light of different colors is extracted with sufficient intensity.

Here, the optical distance L (Lr, Lg, or Lb) is set in the range satisfying Expression (1):

$$(2L)/\lambda + \phi/(2\pi) = m$$

where $\phi$ is the phase shift (radians) occurring when light emitted in the light-emitting device 5r, 5g, or 5b is reflected at both ends of the resonant portion, L is the optical distance of the resonant portion, $\lambda$ is the peak wavelength of the spectrum of light desired to be extracted, and m is an integer.

The optical distance Lr, Lg, or Lb is adjusted by the thickness of the organic layer portion 9 as will be described below. The optical distances Lr, Lg, and Lb satisfy the relationship Lr>Lg>Lb. The integer m is the same for the individual optical distances. Preferably, m=0, in which the optical distances Lr, Lg, and Lb are minimum positive values.

The individual layers constituting each of the light-emitting devices 5r, 5g, and 5b having the microresonator structure will now be described below.

The anode 7 is formed by patterning so as to correspond to each pixel and to be connected to a TFT provided in the pixel through a contact hole (not shown) formed in the interlayer insulating film covering the TFT.

The anode 7 is formed as a mirror by using a highly reflective material. The anode 7 is composed of an electrically conductive material having high reflectance, such as silver (Ag), aluminum (Al), chromium (Cr), iron (Fe), cobalt (Co), nickel (Ni), copper (Cu), tantalum (Ta), tungsten (W), platinum (Pt), gold (Au), or an alloy thereof.

The anode 7 may have a structure in which a barrier layer is disposed on an electrically conductive layer. In such a case, the barrier layer is composed of a material having a large work function and has a thickness of about 1 to 200 nm. The barrier layer is composed of a material that allows the anode 7 to act as a mirror. When the electrically conductive layer is composed of a highly reflective material, a light-transmissive material is used for the barrier layer. When the electrically conductive layer has low reflectance, a highly reflective material is used for the barrier layer.

The barrier layer is composed of a material appropriately selected, in consideration of the combination with the electrically conductive layer, for example, from light-transmissive materials containing at least one metal selected from the group consisting of indium (In), tin (Sn), zinc (Zn), cadmium (Cd), titanium (Ti), chromium (Cr), gallium (Ga), and aluminum (Al), a metal alloy thereof, a metal oxide thereof, or a metal nitride thereof. Examples of the metal alloy include indium-tin alloys and indium-zinc alloys. Examples of the metal oxide include indium-tin-oxide (ITO), indium-zinc-oxide (IZO), indium oxide ($In_2O_3$), tin oxide ($SnO_2$), zinc oxide (ZnO), cadmium oxide (CdO), titanium oxide ($TiO_2$), and chromium oxide ($CrO_2$). Examples of the metal nitride include titanium nitride and chromium nitride (CrN).

The anode (mirror) 7 formed by patterning for each pixel is covered at the periphery by an insulating film 15 with the center being exposed. The insulating film 15 is composed of, for example, an organic insulating material, such as a polyimide or a photoresist, or an inorganic insulating material, such as silicon oxide.

The organic layer portion 9 disposed on the anode (mirror) 7 includes a hole-injection layer 9-1, a hole-transport layer 9-2, a luminescent layer 9-3, and an electron-transport layer 9-4 which are disposed in that order. Among these layers, the luminescent layer 9-3 only is formed by patterning for each of the light-emitting devices 5r, 5g, and 5b. The other layers are provided as common layers for the light-emitting devices 5r, 5g, and 5b.

The individual layers constituting the organic layer portion 9 will be described below from the anode (mirror) 7 side.

First, the hole-injection layer 9-1 is disposed as a common layer for the pixels so as to cover the anodes 7 and the insulating film 15. The hole-injection layer 9-1 is composed of a known hole-injecting material. For example, the hole-injection layer 9-1 is vapor-deposited at a thickness of 15 nm using m-MTDATA [4,4,4-tris(3-methylphenylphenylamino) triphenylamine].

Next, the hole-transport layer 9-2 is disposed, as a common layer for the pixels, on the hole-injection layer 9-1. The hole-transport layer 9-2 is formed using a known hole-transporting material, such as a benzidine derivative, a styrylamine derivative, a triphenylmethane derivative, or a hydrazone derivative. For example, the hole-transport layer 9-2 is vapor-deposited at a thickness of 10 nm using α-NPD [4,4-bis(N-1-naphthyl-N-phenylamino)biphenyl].

Note that each of the hole-injection layer 9-1 and the hole-transport layer 9-2 may have a layered structure including a plurality of sublayers.

The luminescent layer 9-3 is formed by patterning for each pixel so as to completely fill in the opening formed in the insulating film 15. As described above, the optical distances Lr, Lg, and Lb are adjusted such that light with specific wavelengths is resonated between the anode (mirror) 7 and the cathode (half mirror) 13. In this embodiment, the optical distances Lr, Lg, and Lb are adjusted by the difference in the thickness between the luminescent layers 9-3r, 9-3g, and 9-3b.

Consequently, the optical distance Lt of each of the luminescent layers 9-3r, 9-3g, and 9-3b is set so as to satisfy the relationship Lt=L−Lf, where L is the optical distance of the resonant portion of each of the light-emitting devices 5r, 5g, and 5b (i.e., Lr, Lg, or Lb), and Lf is the optical distance of the common functional layers other than the luminescent layers. Furthermore, as described above, since the optical distances Lr, Lg, and Lb of the resonant portions of the light-emitting devices 5r, 5g, and 5b satisfy the relationship Lr>Lg>Lb, the optical distances Lt (thicknesses) of the luminescent layers 9-3r, 9-3g, and 9-3b have the same magnitude relationship.

Furthermore, each of the luminescent layers 9-3r, 9-3g, and 9-3b having the different thicknesses (optical distances Lt) as described above is composed of a host material and a luminescent guest material. Furthermore, an organic material that contributes to a decrease in the resistance of the luminescent layers 9-3r, 9-3g, and 9-3b is added to the luminescent layers in the amounts corresponding to their thicknesses such that the amount of addition increases as the thickness increases. Consequently, the content of the organic material satisfies the relationship 9-3r>9-3g>9-3b. Note that such an organic material may not be added to the luminescent layer 9-3b of the blue light-emitting device 5b, which has the smallest thickness.

The organic material is composed of a material having substantially the same HOMO level as that of the hole-transporting material constituting the hole-transport layer 9-2. With respect to the HOMO level which is substantially the same as that of the hole-transporting material, if the difference in the HOMO level between the organic material and the hole-transporting material is +0.3 eV or less, the resistance can be sufficiently decreased without affecting the luminescence in each of the luminescent layers 9-3r, 9-3g, and 9-3b. The HOMO level of the organic material is preferably as close as possible to that of the hole-transporting material because the effect of decreasing the resistance increases. When the organic material having substantially the same HOMO level as that of the hole-transporting material is used as a host material, the host material is also considered as the organic material, and the total content of the organic material is adjusted.

The content of the organic material is adjusted such that the resulting light-emitting devices 5r, 5g, and 5b have substantially the same drive voltage.

The structures of the luminescent layers 9-3r, 9-3g, and 9-3b will be described below.

The luminescent layer 9-3r of the red light-emitting device 5r is composed of a host material, a guest material, and an organic material for decreasing the resistance. Among them, as the host material, at least one of a hole-transporting host material, an electron-transporting host material, and a hole- and electron-transporting host material is used. For example, anthracene dinaphthyl (ADN), which is an electron-transporting host material, is used. As the guest material, a fluorescent or phosphorescent red luminescent material is used. For example, 2,6-bis[(4'-methoxydiphenylamino)styryl]-1,5-dicyanonaphthalene (BSN) is used. The content of the guest material is, for example, about 30% by weight relative to the total of the host material and the guest material. As the organic material that contributes to the decrease in the resistance of the luminescent layer 9-3r, the same material as that constitutes the hole-transport layer 9-2, for example, α-NPD is used. In the luminescent layer 9-3r, the organic material is contained in an amount of 50% by volume. The luminescent layer 9-3r having such a structure has a thickness of, for example, 60 nm.

The luminescent layer 9-3g of the green light-emitting device 5g is composed of a host material, a guest material, and an organic material for decreasing the resistance. Among them, as the host material, the same material as the host material of the red luminescent layer 9-3r is used, and for example, anthracene dinaphthyl (ADN) is used. As the guest material, a fluorescent or phosphorescent green luminescent material is used. For example, coumarin 6 is used. The content of the guest material is, for example, about 5% by weight relative to the total of the host material and the guest material. As the organic material that contributes to the decrease in the resistance of the luminescent layer 9-3g, the same material as that constitutes the hole-transport layer 9-2, for example, α-NPD is used. In the luminescent layer 9-3g, the organic material is contained in an amount of 33% by volume. The luminescent layer 9-3g having such a structure has a thickness of, for example, 45 nm.

The luminescent layer 9-3b of the blue light-emitting device 5b is composed of a host material and a guest material and does not contain an organic material for decreasing the voltage. Among them, as the host material, the same material as the host material of the red luminescent layer 9-3r or the green luminescent layer 9-3g is used, and for example, anthracene dinaphthyl (ADN) is used. As the guest material, a fluorescent or phosphorescent blue luminescent material is used. For example, 4,4'-bis[2-{4-(N,N-diphenylamino) phenyl}vinyl]biphenyl (DPAVBi) is used. The content of the guest material is, for example, about 2.2% by weight relative to the total of the host material and the guest material. The luminescent layer 9-3b having such a structure has a thickness of, for example, 20 nm.

The electron-transport layer 9-4 disposed on the luminescent layers 9-3r, 9-3g, and 9-3b is provided as a common layer for the individual pixels. The electron-transport layer 9-4 is composed of a known electron-transporting material. For example, the electron-transport layer 9-4 is vapor-deposited at a thickness of about 20 nm using 8-hydroxyquinoline aluminum (Alq3).

The hole-injection layer 9-1, the hole-transport layer 9-2, the luminescent layers 9-3r, 9-3g, and 9-3b, and the electron-transport layer 9-4 constitute the organic layer portion 9.

The electron-injection layer 11 disposed on the organic layer portion 9 is provided as a common layer for the individual pixels. The electron-injection layer 11 is composed of a known electron-injecting material. For example, the electron-injection layer 11 is vapor-deposited at a thickness of about 0.3 nm using LiF.

The cathode 13 disposed on the electron-injection layer 11 is provided as a common layer for the individual pixels. The cathode 13 is composed of an electrically conductive material having a small work function. Examples of such an electrically conductive material which may be used include alloys of an active metal, such as Li, Mg, or Ca, and a metal, such as Ag, Al, or In, and laminates of these metals. Since the cathode 13 is used as a half mirror, the thickness is adjusted depending on the material used so that the reflectance is in the range of 0.1% or more to less than 50%. As the cathode 13, for example, MgAg with a thickness of 10 nm is used. Furthermore, at the interface with the electron-injection layer 11, a thin compound layer composed of an active metal, such as Li, Mg, or Ca and a halogen, such as fluorine or bromine, or oxygen may be interposed.

When the cathode 13 is used as a common electrode for the individual pixels as described above, a structure may be employed in which an auxiliary electrode (not shown) is formed in the same layer as that of the anode 7, and by connecting the cathode 13 to the auxiliary electrode, the voltage drop of the cathode 13 is prevented. In such a case, the organic layer portion disposed on the auxiliary electrode is removed by laser ablation or the like immediately before the formation of the cathode 13.

The light-emitting devices 5r, 5g, and 5b having the structure described above are covered with a protective film (not shown). A sealing substrate is bonded onto the protective film with an adhesive to constitute a solid-state display unit 1.

The protective film is disposed for the purpose of preventing moisture from reaching the organic layer portion 9, and is formed with a sufficient thickness using a material having low water permeability and low water absorption. In this embodiment, since the display unit 1 fabricated is of a top-emission type, the protective film is composed of a material that transmits light generated in the light-emitting devices 5r, 5g, and 5b, and for example, a transmittance of about 80% is secured. The protective film may be composed of an insulating material or an electrically conductive material. When the protective film is composed of an insulating material, an inorganic amorphous insulating material, such as amorphous silicon ($\alpha$-Si), amorphous silicon carbide ($\alpha$-SiC), amorphous silicon nitride ($\alpha$-Si$_{1-x}$N$_x$), or amorphous carbon ($\alpha$-C), can be suitably used. Since such an inorganic amorphous, insulating material does not form grains, it has low water permeability, and thus can form a satisfactory protective film. When the protective film is composed of an electrically conductive material, a transparent electrically conductive material, such as ITO or IZO, is used.

As the adhesive, for example, a UV curable resin is used. As the sealing substrate, for example, a glass substrate is used. Note that the adhesive and the sealing substrate are composed of light-transmissive materials.

Furthermore, a color filter may be disposed above the cathode (half mirror) 13 (on the light extraction side), the color filter transmitting light in the wavelength range that is resonated in the resonator portion and extracted. Thus, the color purity of light extracted from each of the light-emitting devices 5r, 5g, and 5b is further improved.

In the display unit 1 having the structure described above, the luminescent layers 9-3r, 9-3g, and 9-3b having different thicknesses are allowed to contain the hole-transporting material constituting the hole-transport layer 9-2 (organic material for decreasing the resistance) in amounts according to the thickness thereof. That is, in the light-emitting devices (organic electroluminescent devices) 5r, 5g, and 5b, by allowing the luminescent layers 9-3r, 9-3g, and 9-3b to contain such an organic material, the resistance of each of the luminescent layers 9-3r, 9-3g, and 9-3b is decreased, and thus the drive voltages for the devices can be decreased. Consequently, by allowing the red luminescent layer 9-3r and the green luminescent layer 9-3g having a larger thickness and higher resistance to contain a larger amount of the organic material, the drive voltages of the light-emitting devices 5r, 5g, and 5b can be leveled out at the low value.

As a result, it is not necessary to individually decrease the power supply voltage applied to the display unit 1 so as to meet the required drive voltages for the individual devices. Thus, the white balance can be set easily in full color display and color reproducibility can be improved. It is also possible to reduce waste power consumption during decreases in the voltage, and low power consumption can be realized.

Furthermore, in the red light-emitting device 5r and the green light-emitting device 5g, in which the driving voltages are decreased, the luminance lifetime can be improved. In the display unit 1 including the light-emitting devices 5r, 5g, and 5b, a long lifetime can be achieved.

Fabrication Method of Display Unit

A method for fabricating the display unit 1 having the structure described above will now be described with reference to FIGS. 2A to 2H, which are schematic cross-sectional views showing the fabrication steps. In the individual layers shown below, the duplicate description will be omitted with respect to the layers already described above with reference to FIG. 1.

First, as shown in FIG. 2A, anodes (mirrors) 7 are formed by patterning on a substrate 3, and then an insulating film 15 is formed by patterning so as to expose the center of each anode (mirror) 7. Subsequently, a hole-injection layer 9-1 is vapor-deposited over the entire surface of the substrate 3 so as to cover the anodes (mirrors) 7 and the insulating film 15, and then a hole-transport layer 9-2 is formed thereon by vapor deposition.

Subsequently, a step of forming luminescent layers of the individual colors on the hole-transport layer 9-2 using a thermal transfer method is carried out, which is a characteristic step of this embodiment.

Figure 2B:
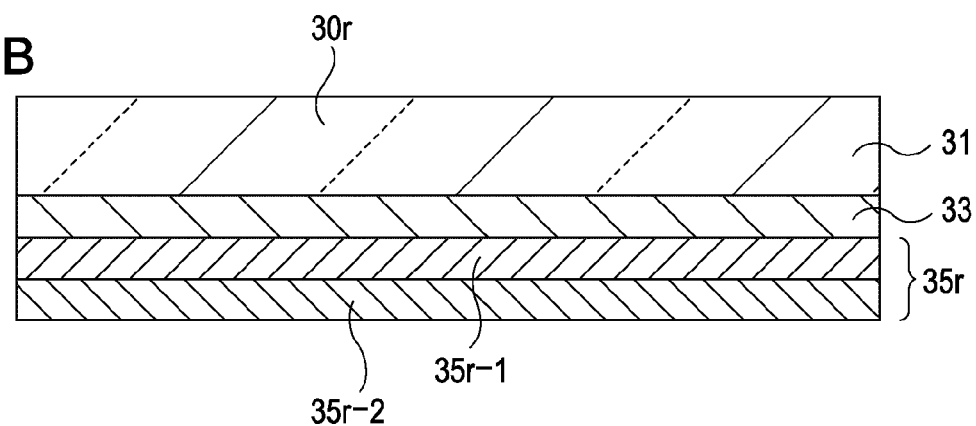

First, as shown in FIG. 2B, a transfer substrate 30r is prepared. The transfer substrate 30r includes a glass base 31 having substantially the same shape as that of the substrate 3 for the display unit fabrication, and a transfer layer (red transfer layer) 35r for forming a red luminescent layer disposed over the entire surface of the glass base 31 with a light-absorption layer 33 therebetween.

As the material for the light-absorption layer 33, a material that has low reflectance with respect to light in the wavelength range of laser light used as a heat source in the subsequent heat transfer step is preferably used. For example, when laser light with a wavelength of about 800 nm from a solid-state laser light source is used, a material having low reflectance and high melting point, such as chromium (Cr) or molybdenum (Mo), is preferably used although not limited thereto. Here, for example, Cr is deposited by sputtering at a thickness of 200 nm to form a light-absorption layer 33.

The red transfer layer 35r is formed using the materials contained in the red luminescent layer (9-3r) described above with reference to FIG. 1. That is, the red transfer layer 35r is composed of a host material, a luminescent guest material, and an organic material for decreasing the resistance.

The red transfer layer 35r composed of the materials described above has a two-layer structure including a luminescent material layer 35r-1 composed of the host material and the guest material and a resistance-decreasing layer 35r-2 composed of the organic material for decreasing the resistance, the luminescent material layer 35r-1 and the resistance-decreasing layer 35r-2 being disposed in that order on the light-absorption layer 33.

The luminescent material layer 35r-1 is, for example, composed of a material prepared by mixing 30% by weight of 2,6-bis[(4'-methoxydiphenylamino)styryl]-1,5-dicyanonaphthalene (BSN), which is a red luminescent guest material, into anthracene dinaphthyl (ADN), which is an electron-transporting host material, and is vapor-deposited at a thickness of about 30 nm.

The resistance-decreasing layer 35r-2 is, for example, vapor-deposited at a thickness of about 30 nm using α-NPD, which is a hole-transporting material.

Figure 2C:
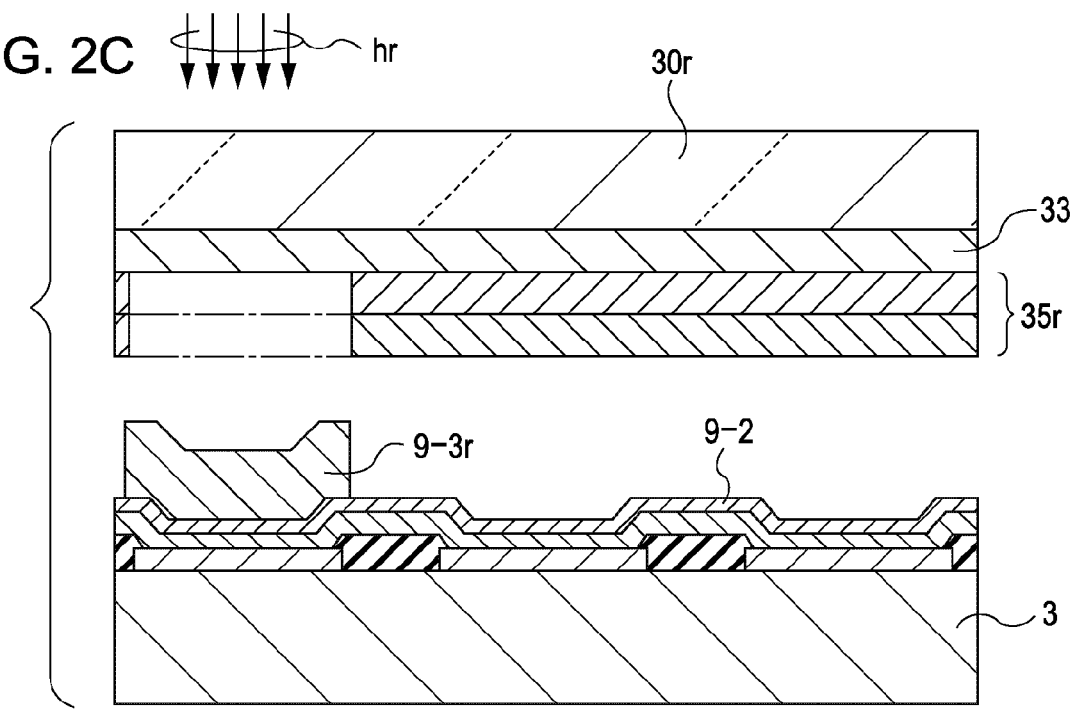

Subsequently, as shown in FIG. 2C, the transfer substrate 30r having the structure described above is placed so as to face the substrate 3 on which layers up to the hole-transport layer 9-2 have been formed. At this stage, the transfer substrate 30r and the substrate 3 are arranged so that the red transfer layer 35r and the hole-transport layer 9-2 face each other. If the insulating film 15 has a sufficient height, the substrate 3 and the transfer substrate 30r may be brought into close contact with each other so that the hole-transport layer 9-2 corresponding to the top layer on the substrate 3 side is in contact with the red transfer layer 35r corresponding to the top layer on the transfer substrate 30r side. Even in such a case, the transfer substrate 30 is supported by the insulating film 15 on the substrate 3 side, and the transfer substrate 30r is not in contact with the portions of the hole-transport layer 9-2 located above the anodes 7.

Subsequently, the transfer substrate 30r placed so as to face the substrate 3 as described above is, for example, irradiated with laser light hr with a wavelength of 800 nm. At this stage, spot irradiation of laser light hr is performed selectively on the portion corresponding to the red light-emitting device-forming region.

Thus, the light-absorption layer 33 is allowed to absorb laser light hr, and using the heat thereof, the red transfer layer 35r is thermally transferred onto the substrate 3 side. A red luminescent layer 9-3r, which is the portion of the red transfer layer 35r thermally transferred with high positional accuracy, is formed by patterning on the hole-transport layer 9-2 disposed on the substrate 3.

In such a thermal transfer step, for example, the concentration gradient of the individual materials constituting the red transfer layer 35r on the transfer substrate 30r side is adjusted by the irradiation energy of laser light hr. Specifically, by setting the irradiation energy at a high level, a red luminescent layer 9-3r is formed as a mixture layer in which the materials constituting the red transfer layer 35r are mixed substantially uniformly. Alternatively, the irradiation energy may be adjusted so that a mixture layer in which the materials constituting the red transfer layer 35r are mixed is provided in the red luminescent layer 9-3r.

Furthermore, it is important to perform irradiation of laser light hr such that the portion above the anode 7 exposed from the insulating film 15 in the red light-emitting device-forming region (pixel region) is completely covered with the red luminescent layer 9-3r.

By repeating the thermal transfer steps described above, the green luminescent layer and the blue luminescent layer are formed in sequence.

Figure 2D:
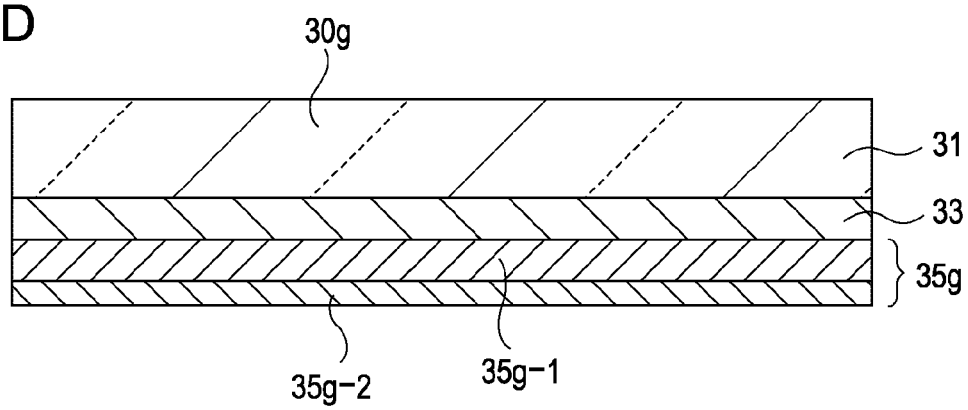

That is, as shown in FIG. 2D, a transfer substrate 30g is prepared, the transfer substrate 30g including a glass base 31 having substantially the same shape as that of the substrate for the display unit fabrication, and a transfer layer (green transfer layer) 35g for forming a green luminescent layer disposed over the entire surface of the glass base 31 with a light-absorption layer 33 therebetween. The green transfer layer 35g may have the same two-layer structure as that of the red transfer layer 35r described with reference to FIG. 2B except that a green luminescent guest material is used as the luminescent guest material.

That is, the luminescent material layer 35g-1 is, for example, composed of a material prepared by mixing 5% by weight of coumarin 6, which is a green luminescent guest material, into anthracene dinaphthyl (ADN), which is an electron-transporting host material, and is vapor-deposited at a thickness of about 30 nm.

The resistance-decreasing layer 35g-2 on the luminescent material layer 35g-1 is vapor-deposited at a thickness of about 15 nm using α-NPD.

Figure 2E:
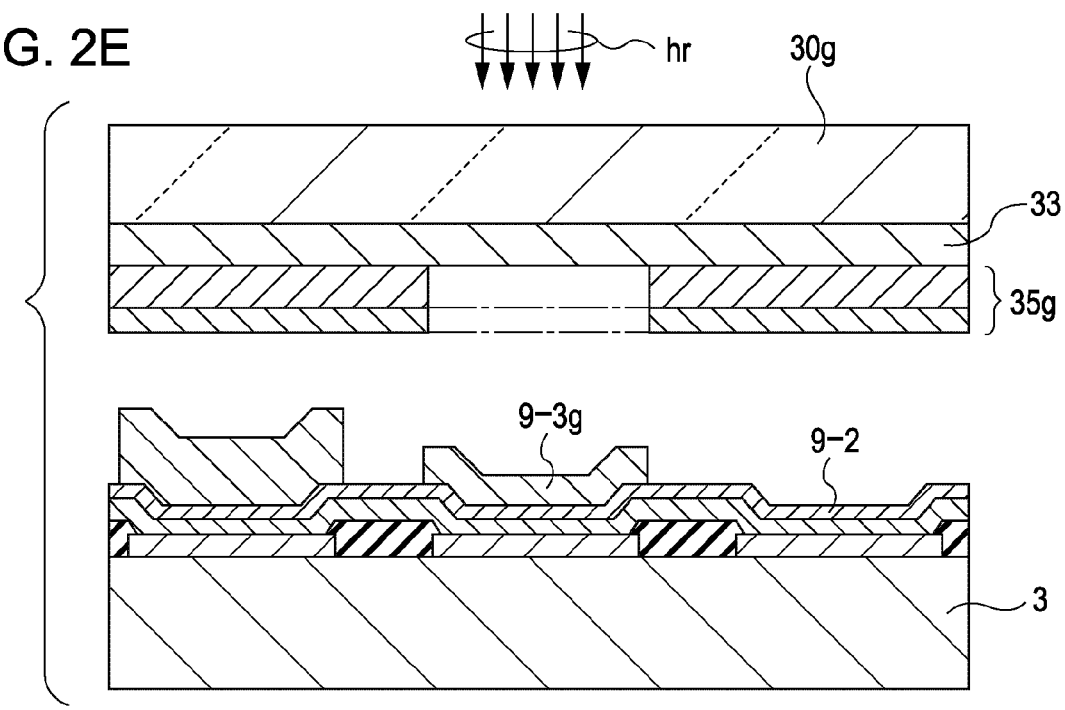

Subsequently, as shown in FIG. 2E, the transfer substrate 30g is placed so as to face the substrate 3 provided with the hole-transport layer 9-2, and spot irradiation of laser light hr is performed, from the transfer substrate 30g side, selectively on the portion corresponding to the green light-emitting device-forming region.

Thus, a green luminescent layer 9-3g, which is the green transfer layer 35g selectively thermally transferred, is formed by patterning on the hole-transport layer 9-2 disposed on the substrate 3. In such a thermal transfer step, as in the formation of the red luminescent layer 9-3r by patterning described above with reference to FIG. 2C, the green luminescent layer 9-3g is formed as a mixture layer in which the materials constituting the green transfer layer 35g are mixed substantially uniformly.

Figure 2F:
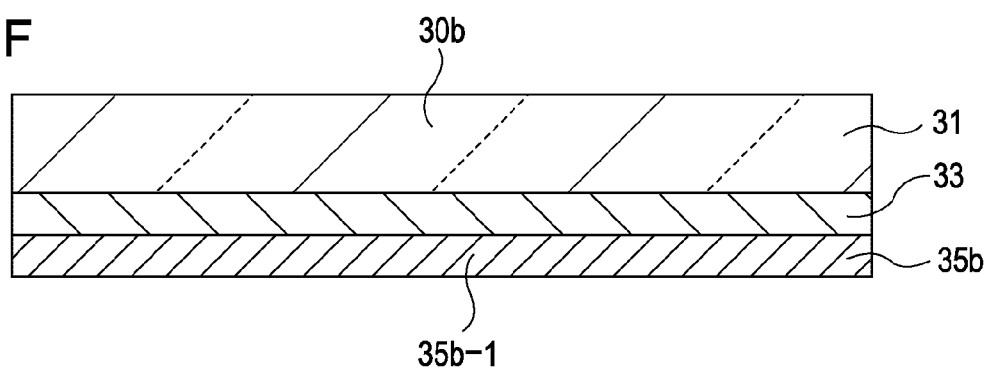

Furthermore, as shown in FIG. 2F, a transfer substrate 30b is prepared, the transfer substrate 30b including a glass base 31 having substantially the same shape as that of the substrate for the display unit fabrication, and a transfer layer (blue transfer layer) 35b for forming a blue luminescent layer disposed over the entire surface of the glass base 31 with a light-absorption layer 33 therebetween. The blue transfer layer 35b has a single-layer structure including a luminescent material layer 35b-1 composed of a host material and a blue luminescent guest material as a luminescent guest material. The luminescent material layer 35b-1 is, for example, composed of a material prepared by mixing 2.5% by weight of 4,4'-bis[2-{4-(N,N-diphenylamino)phenyl}vinyl]biphenyl (DPAVBi), which is a blue luminescent guest material, into ADN, which is an electron-transporting host material, and is vapor-deposited at a thickness of about 20 nm.

Figure 2G:
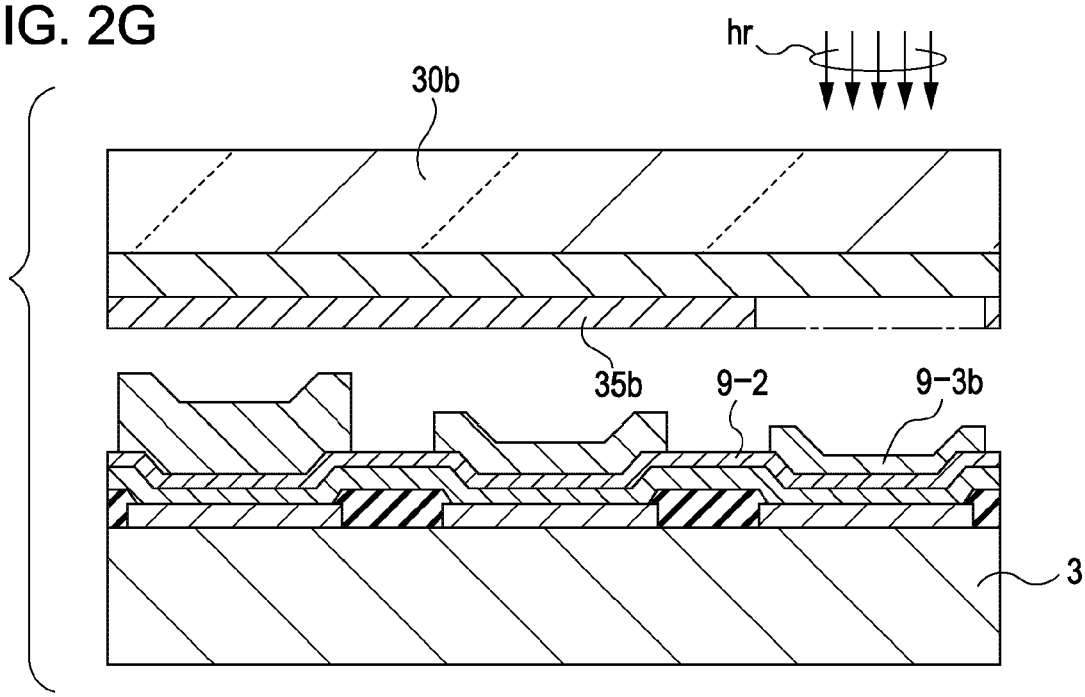

Subsequently, as shown in FIG. 2G, the transfer substrate 30b is placed so as to face the substrate 3 provided with the hole-transport layer 9-2, and spot irradiation of laser light hr is performed, from the transfer substrate 30b side, selectively on the portion corresponding to the blue light-emitting device-forming region.

Thus, a blue luminescent layer 9-3b, which is the blue transfer layer 35b selectively thermally transferred, is formed by patterning on the hole-transport layer 9-2 disposed on the substrate 3. In such a thermal transfer step, as in the formation of the red luminescent layer 9-3r by patterning described above with reference to FIG. 2C, the blue luminescent layer 9-3b is formed as a mixture layer in which the materials constituting the blue transfer layer 35b are mixed substantially uniformly.

The order of the thermal transfer steps described above with reference to FIGS. 2B to 2G is not particularly limited. The thermal transfer step may be carried out from any of the luminescent layers 9-3r, 9-3b, and 9-3b.

Furthermore, the thermal transfer steps repeatedly carried out can be performed in the air, but are preferably performed in a vacuum. By performing thermal transfer in a vacuum, it is possible to perform transfer using a laser with a lower energy, and thus the thermally adverse effect on the luminescent layer to be transferred can be alleviated. Furthermore, by carrying out the thermal transfer steps in a vacuum, adhesion between the substrates is increased, and transfer pattern accuracy is improved, which is desirable. Moreover, by carrying out the whole process in a vacuum, it is possible to prevent the degradation of the devices.

In the step of performing spot irradiation of laser light hr, when the driving member of the laser head of the laser irradiation equipment has an accurate alignment mechanism, laser light hr is applied, with an appropriate spot diameter, onto the transfer substrate (30r, 30g, or 30b) along the anode 7. In such a case, it is not necessary to exactly align the substrate 3 with the transfer substrate (30r, 30g, or 30b). On the other hand, when the driving member of the laser head of the laser irradiation equipment does not have an accurate alignment mechanism, it is necessary to form a light-shielding film to limit the region which is irradiated with laser light hr on the transfer substrate side. Specifically, a light-shielding film is formed on the back surface of the transfer substrate 31, the light-shielding film being composed of a high-reflection metal layer which reflects laser light and provided with openings. A low-reflection metal layer may also be disposed thereon. In such a case, it is necessary to exactly align the substrate 3 with the transfer substrate (30r, 30g, or 30b).

Figure 2H:
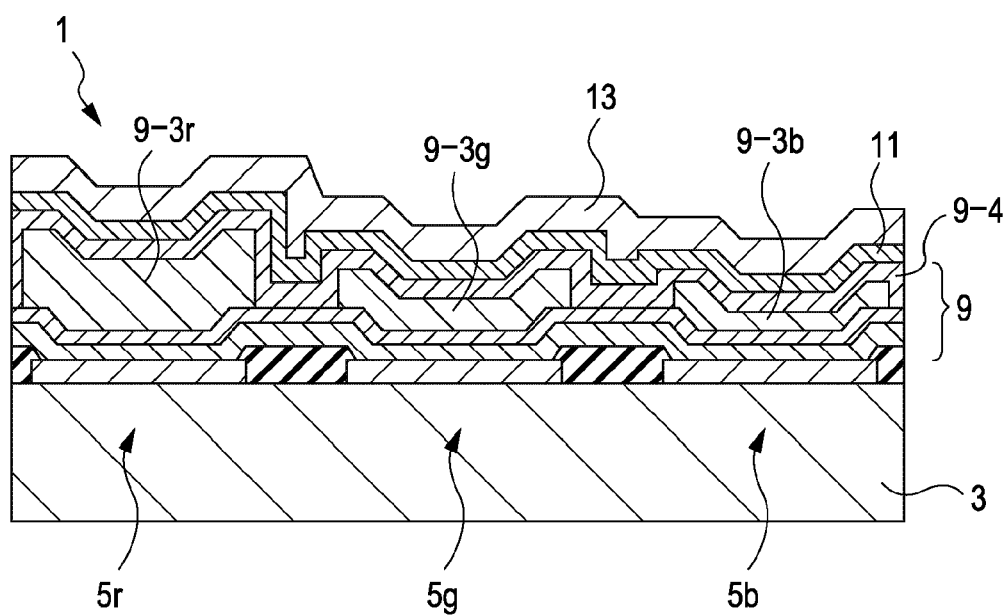

Subsequently, as shown in FIG. 2H, an electron-transport layer 9-4 is formed by vapor deposition so as to cover the entire surface of the substrate 3 provided with the luminescent layers 9-3r, 9-3g and 9-3b, and an electron-injection layer 11 and a cathode 13 are formed further thereon. Preferably, the cathode 13 is formed by a deposition method in which energy of particles deposited is small to such an extent that does not adversely affect the underlying organic layer portion 9, for example, by a vapor deposition method or a chemical vapor deposition (CVD) method.

After the organic electroluminescent devices 5r, 5g, and 5b are formed as described above, a protective film (not known) is formed. Preferably, the protective film is formed at normal temperature in order to prevent a decrease in luminance due to the degradation of the organic layer portion 9 and under the conditions that minimize the stress of the film in order to prevent the separation of the protective film. Subsequently, a sealing substrate is bonded onto the protective film with an adhesive to complete the fabrication of the display unit 1.

In the fabrication method described above, for example, as described with reference to FIG. 2C, the red transfer layer 35r composed of the hole-transporting material together with the charge-transporting host material and the luminescent guest material is thermally transferred as the red luminescent layer 9-3r. Thus, the red luminescent layer 9-3r formed by thermal transfer is composed of a ternary mixture in which the luminescent guest material and the hole-transporting material (i.e., the organic material for decreasing the resistance) are mixed in the charge-transporting host material. In this case, the thickness of the red luminescent layer 9-3r and the content of the hole-transporting material (i.e., the organic material for decreasing the resistance) in the red luminescent layer 9-3r can be adjusted with high accuracy by the thicknesses of the luminescent material layer 35r-1 and the resistance-decreasing layer 35r-2 constituting the red transfer layer 35r.

Consequently, it is possible to form the individual luminescent layers 9-3r, 9-3g, and 9-3b which are allowed to contain the organic material for decreasing the resistance in amounts that increase with thickness, with high thickness accuracy and with high composition accuracy.

In each of the embodiments described above, the example in which the display unit 1 is of an active matrix type has been described. The present invention is also applicable to a display unit of a passive matrix type. In such a case, for example, strip-shaped anodes 7 and strip-shaped cathodes 13 are disposed so as to intersect each other, and at each intersection, a red light-emitting device 5r, a green light-emitting device 5g, or a blue light-emitting device 5b is provided in the region in which an organic layer portion 9 containing a luminescent layer 9-3r, 9-3g, or 9-3b is interposed.

In the display unit of the passive matrix type described above, since the driving circuit for each pixel is not provided on the substrate 3 side, even if the display unit is designed to be of a bottom-emission type in which emitted light is extracted from the substrate 3 side, the opening ratio of the pixel can be maintained.

In such a bottom-emission type, the anode 7 placed on the substrate 3 is formed as a half mirror, and the cathode 13 is formed as a mirror. Thus, resonant wavelengths are extracted through the anode 7 from the substrate 3 side. In such a case, materials having suitable light reflection and transmission characteristics are selected for the substrate 3, the anode 7, and the cathode 13. Furthermore, in the case of the bottom-emission type, the stacking order of the layers from the anode 7 to the cathode 13 in the embodiment described above may be reversed.

Furthermore, according to another embodiment, in a display unit of an active matrix type, the stacking order of the layers from the anode 7 to the cathode 13 in the embodiment described above may be reversed. In the display unit of the active matrix type, since the driving circuit for each pixel is provided on the substrate 3 side, it is advantageous to design the display unit to be of a top-emission type in which emitted light is extracted from the side opposite to the substrate 3 from the standpoint that the opening ratio of the pixel is increased. In such a case, materials are appropriately selected so that the cathode 13 disposed on the substrate 3 side acts as a mirror and the anode 7 disposed on the light extraction side acts as a half mirror.

Furthermore, the present application is also applicable to a display unit of a transmissive type which can be either passive matrix or active matrix, i.e., in which emitted light can be extracted from both the substrate 3 side and the counter substrate side.

In each of the embodiments described above, as the light-emitting devices 5r, 5g, and 5b respectively including the luminescent layers 9-3r, 9-3g, and 9-3b which have different thicknesses, the light-emitting devices 5r, 5g, and 5b each having a resonator structure have been described. In the present invention, as long as the luminescent layers 9-3r, 9-3g, and 9-3b have different thicknesses, the structure is not limited to the resonator structure. For example, even in a structure in which light generated in the luminescent layer 9-3r, 9-3g, or 9-3b is reflected once to cause interference before being extracted, since the luminescent layers 9-3r, 9-3g, and 9-3b have different thicknesses, driving voltages vary. Even in the display unit having such a structure, by incorporating the organic material for decreasing the resistance into the luminescent layers according to the thickness, it is possible to level out the drive voltages.

In each of the embodiments described above, use of the light-emitting devices in which the optical distance in the resonant portion is adjusted only by the luminescent layer has been described. However, the present application is widely applicable to display units including light-emitting devices whose luminescent layers have different thicknesses. For example, the present invention is applicable to a display unit including light-emitting devices in which the optical distance is adjusted by the thickness of the luminescent layer together with the thickness of a conductive layer, and the same effect can be obtained.

Furthermore, the present application is also applicable to a display device having an organic electroluminescent element including units of organic layers having luminescent layers (light-emitting units) which are stacked, such as the one disclosed in Japanese Unexamined Patent Application Publication No. 2003-272860, and the same effect can be obtained.

EXAMPLES

The examples according to an embodiment and comparative examples will be described below with reference to FIGS. 2A to 2H. In each of the examples and comparative examples, an organic electroluminescent device constituting a full color display unit was fabricated. The evaluation results will also be described below.

Example 1

A red light-emitting device 5r constituting a display unit was fabricated as follows.

Step 1: First, on a glass substrate 3, i.e., a substrate for fabricating the device, an APC (Ag—Pd—Cu) layer, i.e., a silver alloy layer, (thickness 120 nm) was formed as an anode (mirror) 7. Then, an insulating film 15 composed of silicon oxide was formed by sputtering at a thickness of about 2 μm so as to cover the anode 7, and the anode 7 was exposed using lithography. As a hole-injection layer 9-1, m-MTDATA was vapor-deposited thereon at a thickness of 15 nm. Then, as a hole-transport layer 9-2, α-NPD was vapor-deposited thereon at a thickness of 10 nm.

Step 2: Next, a transfer substrate 30r was prepared as follows. First, on a light-absorption layer 33 formed on a glass base 31, a luminescent material layer 35r-1 obtained by mixing 30% by weight of a red luminescent guest material composed of BSN into a host material composed of ADN was formed by vacuum deposition at a thickness of 30 nm, and a resistance-decreasing layer 35r-2 composed of α-NPD was formed thereon by vacuum deposition at a thickness of 30 nm. In this case, the thickness ratio of the luminescent material layer to the resistance-decreasing layer was 50:50.

Step 3: The transfer substrate 30r prepared in Step (2) was placed above the substrate 3 for fabricating the device such that the deposited organic layers face each other. A small space of about 2 μm was maintained between the substrates because of the thickness of the insulating film 15. In the drawings, the height of the insulating film 15 is shown lower than the actual value. In such a state, laser light with a wavelength of 800 nm was applied to the back side of the transfer substrate 30r at the position corresponding to the red pixel region of the substrate 3 for fabricating the substrate 3. Thus, the red transfer layer 35r was thermally transferred from the transfer substrate 30r to form a red luminescent layer 9-3r. The spot size of laser light was 300 μm×10 μm. Laser scanning was performed in a direction perpendicular to the longitudinal direction. The energy density was 2.6 E-3 mJ/μm². The content of the organic material (α-NPD) for decreasing the resistance in the red luminescent layer 9-3r was 50% by volume.

Step 4: After the red luminescent layer 9-3r was transferred, an electron-transport layer 9-4 was formed. As the electron-transport layer 9-4, 8-hydroxyquinoline aluminum (Alq3) was vapor-deposited at a thickness of about 20 nm. Subsequently, as an electron-injection layer 11, LiF was vapor-deposited at a thickness of about 0.3 nm (vapor deposition rate 0.01 nm/sec). Then, as a cathode (half mirror), MgAg was vapor-deposited at a thickness of 10 nm. Thereby, a red light-emitting device 5r was obtained.

Comparative Example 1

A red light-emitting device was fabricated as in Example 1 except that in the preparation of the transfer substrate 30r in Step 2, the luminescent material layer 35r-1 only was formed at a thickness of 60 nm, and the resistance-decreasing layer 35r-2 was not formed.

Example 2

A green light-emitting device 5g was fabricated as in Example 1 except that in the preparation of the transfer substrate 30r in Step 2, the materials for the luminescent material layer were changed to form a transfer substrate 30g.

That is, in the preparation of the transfer substrate 30g, on the light-absorption layer 33 formed on the glass base 31, a luminescent material layer 35g-1 obtained by mixing 5% by weight of a green luminescent guest material composed of coumarin 6 into a host material composed of ADN was formed by vacuum deposition at a thickness of 30 nm, and a resistance-decreasing layer 35g-2 composed of α-NPD was formed thereon by vacuum deposition at a thickness of 15 nm. In this case, the thickness ratio of the luminescent material layer 35g-1 to the resistance-decreasing layer 35g-2 was 30:15.

Subsequently, using the transfer substrate thus prepared, a green light-emitting device 5g was fabricated as in Steps 3 and 4 of Example 1. Note that the content of the organic material (α-NPD) for decreasing the resistance in the green luminescent layer 9-3g was 33% by volume.

Comparative Example 2

A green light-emitting device was fabricated as in Example 2 except that in the preparation of the transfer substrate 30g in Step 2, the luminescent material layer 35g-1 only was formed at a thickness of 45 nm, and the resistance-decreasing layer 35g-2 was not formed.

Example 3

A blue light-emitting device 5b was fabricated as in Example 1 except that in the preparation of the transfer substrate 30r in Step 2, the materials for the luminescent material layer were changed, and a transfer substrate 30b was prepared without forming the resistance-decreasing layer 35g-2.

That is, in the preparation of the transfer substrate 30b in Step 2, on the light-absorption layer 33 formed on the glass base 31, a luminescent material layer 35b-1 obtained by mixing 2.5% by weight of a blue luminescent guest material composed of DPAVBi into a host material composed of ADN was formed by vacuum deposition at a thickness of 20 nm.

Subsequently, using the transfer substrate 30b thus prepared, a blue light-emitting device 5b was fabricated as in Steps 3 and 4 of Example 1. Note that the content of the organic material (α-NPD) for decreasing the resistance in the blue luminescent layer 9-3b was 0% by volume.

Evaluation Results

With respect to the organic electroluminescent devices of the individual colors fabricated as described above, the chromaticity and luminous efficiency were measured using a spectral radiance meter in the presence of an applied constant current density of 10 mA/cm$^2$. Furthermore, the drive voltage was measured under the conditions that a current was applied so that the devices fabricated using the same luminescent guest material emitted light with the same luminance. Furthermore, life tests were carried out to measure the reduction in relative luminance after 100 hours. The results thereof are shown in Table 1 below.

When comparison is made between the evaluation results of the light-emitting devices fabricated in Examples 1 and 2 and the evaluation results of the light-emitting devices fabricated in Comparative Examples 1 and 2, respectively, it is evident that the light-emitting devices of Examples 1 and 2, in each of which the transfer layer including the luminescent material layer and the resistance-decreasing layer is thermally transferred to form the luminescent layer, which is the mixed layer of the materials constituting the luminescent material layer and the resistance-decreasing layer, have the effect of decreasing the drive voltage while maintaining substantially the same luminous efficiency and reduction in luminance compared with the light-emitting devices of Comparative Examples 1 and 2. Furthermore, it is evident that the light-emitting devices of Examples 1 and 2 have substantially the same chromaticity as that of the light-emitting devices of Comparative Examples 1 and 2, respectively.

In particular, when the evaluation results of the red light-emitting device fabricated in Example 1 are compared with those of the red light-emitting device fabricated in Comparative Example 1 without including the resistance-decreasing layer, it is evident that by forming the transfer layer using an appropriate amount of the resistance-decreasing layer, the drive voltage can be appropriately reduced without changing the emitted color of the resulting red light-emitting device, and the reduction in luminance is lower than the comparative example.

With respect to the red light-emitting device, as shown in Example 1, substantially no decrease in luminous efficiency due to the use of the resistance-decreasing layer is observed. With respect to the green light-emitting device, as shown in Example 2, a slight decrease in luminous efficiency due to the use of the resistance-decreasing layer is observed. The reason for this is that originally low energy is sufficient for red light emission compared with short-wavelength emission, such as blue or green light emission, and substantially no effect of decreasing the resistance is caused by incorporation of the resistance-decreasing layer.

With respect to the light-emitting devices of Examples 1, 2, and 3, since the content of the organic material for decreasing the resistance in the luminescent layer is appropriately adjusted by the thickness of the resistance-decreasing layer, (specifically, the content is higher for the device that emits light with a longer wavelength), the drive voltage is substantially at the same level in spite of the fact that the thickness of the luminescent layers increases with the emission wavelength of the luminescent layers of the individual colors.

As is evident from the results described above, by allowing the luminescent layers 9-3r, 9-3g, and 9-3b to contain the organic material for decreasing the resistance in the amounts

TABLE 1

| | | Content of organic material for decreasing resistance | CIE chromaticity | Luminous efficiency [cd/A] | Reduction in luminance [%] | Drive voltage [V] |
|---|---|---|---|---|---|---|
| Red light-emitting device | Example 1 | 50 [% by volume] | 0.64, 0.32 | 5.3 | 15 | 6.3 |
| | (Comparative Example 1) | — | 0.63, 0.32 | 5.5 | 17 | 10.5 |
| Green light-emitting device | Example 2 | 33 [% by volume] | 0.22, 0.68 | 13.0 | 15 | 5.9 |
| | (Comparative Example 2) | — | 0.22, 0.66 | 15.0 | 14 | 9 |
| Blue light-emitting device | Example 3 | 0 [% by volume] | 0.16, 0.21 | 6.2 | 11 | 6.2 | corresponding to their thicknesses, even if the luminescent layers 9-3r, 9-3g, and 9-3b in the light-emitting devices 5r, 5g, and 5b have extremely different thicknesses because of the use of the resonator structure, the drive voltages therefor can be leveled out. Thus, it is possible to reduce power consumption in the full color display unit.

Moreover, it is confirmed that such an effect can be obtained without degrading the chromaticity and without decreasing the luminous efficiency or reduction in luminance.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit comprising a plurality of organic electroluminescent devices, each including:
    an organic layer portion including at least a hole-transport layer and a luminescent layer which are stacked each other; and
    two electrodes sandwiching the organic layer portion,
    wherein the luminescent layers of the individual organic electroluminescent devices have different thicknesses; and
    the luminescent layer in each organic electroluminescent device contains an organic material having substantially the same HOMO level as that of a hole-transporting material constituting the hole-transport layer, the content of the organic material being set so as to increase with the thickness of the luminescent layer.

2. The display unit according to claim 1, wherein the organic material in each organic electroluminescent device is content adjusted so that the individual organic electroluminescent devices have substantially the same drive voltage.

3. The display unit according to claim 1, wherein a mirror composed of a light reflection material and a semi-transmissive half mirror are provided to each organic electroluminescent device so as to sandwich the hole-transport layer and the luminescent layer, and the optical distance between the mirror and the half mirror is adjusted by the thickness of the luminescent layer such that a resonator structure is formed in which light with specific wavelengths emitted from the luminescent layer is resonated between the mirror and the half mirror and is extracted from the half mirror side.

4. The display unit according to claim 3, wherein the luminescent layer in each organic electroluminescent device emits light in the wavelength range of blue, green, or red, and each organic electroluminescent device is designed such that extraction of light in the wavelength range of blue, green, or red is maximized and the optical distance between the mirror and the half mirror increases as the wavelength of light emitted increases.

5. The display unit according to claim 3, wherein the mirror and the half mirror are used as the electrodes.

6. The display unit according to claim 1, wherein among a plurality of layers constituting the organic layer portion, the luminescent layer only is formed by patterning for each organic electroluminescent device, and the other layers are provided as common layers for the individual organic electroluminescent devices.

7. A method for fabricating a display unit including a plurality of organic electroluminescent devices, each including:
    an organic layer portion including at least a hole-transport layer and a luminescent layer which are stacked each other, and two electrodes sandwiching the organic layer portion,
    wherein the luminescent layers of the individual organic electroluminescent devices have different thicknesses; and the luminescent layer in each organic electroluminescent device contains an organic material having substantially the same HOMO level as that of a hole-transporting material constituting the hole-transport layer, the content of the organic material increasing with the thickness of the luminescent layer,
    the method comprising: forming each of the luminescent layers by patterning by thermally transferring a transfer layer from a transfer substrate, the transfer layer containing a charge-transporting host material and a luminescent guest material,
    wherein the transfer layer for forming at least some of the luminescent layers contains a predetermined amount of the organic material together with the host material and the guest material.

8. The method for fabricating the display unit according to claim 7, wherein the transfer layer containing the organic layer has a structure in which a luminescent material layer containing the host material and the guest material and a resistance-decreasing layer containing the organic material are stacked.

* * * * *